United States Patent
Peng et al.

(10) Patent No.: US 11,563,138 B2
(45) Date of Patent: Jan. 24, 2023

(54) METHOD TO DEPOSIT THIN FILM HIGH QUALITY ABSORBER LAYER

(71) Applicants: CHINA TRIUMPH INTERNATIONAL ENGINEERING CO., LTD., Shanghai (CN); CTF SOLAR GMBH, Dresden (DE)

(72) Inventors: Shou Peng, Shanghai (CN); Xinjian Yin, Shanghai (CN); Ganhua Fu, Shanghai (CN); Krishnakumar Velappan, Dresden (DE); Michael Harr, Kelkheim-Ruppertshain (DE); Bastian Siepchen, Dresden (DE)

(73) Assignees: CHINA TRIUMPH INTERNATIONAL ENGINEERING CO., LTD., Shanghai (CN); CTF SOLAR GMBH, Dresden (DE)

(*) Notice: Subject to any disclaimer, the term of this patent is extended or adjusted under 35 U.S.C. 154(b) by 0 days.

(21) Appl. No.: 17/631,877

(22) PCT Filed: Aug. 8, 2019

(86) PCT No.: PCT/CN2019/099810
§ 371 (c)(1),
(2) Date: Jan. 31, 2022

(87) PCT Pub. No.: WO2021/022558
PCT Pub. Date: Feb. 11, 2021

(65) Prior Publication Data
US 2022/0352408 A1    Nov. 3, 2022

(51) Int. Cl.
*H01L 31/18*    (2006.01)
*H01L 31/0296*    (2006.01)
(Continued)

(52) U.S. Cl.
CPC ...... *H01L 31/1832* (2013.01); *C23C 14/0629* (2013.01); *C23C 14/541* (2013.01); *H01L 31/02966* (2013.01)

(58) Field of Classification Search
CPC ............. H01L 51/502; H01L 31/073; H01L 31/02966; H01L 31/1832; H01L 31/1828;
(Continued)

(56) References Cited

U.S. PATENT DOCUMENTS

| | | | |
|---|---|---|---|
| 8,021,914 B2 * | 9/2011 | Hails | ............ H01L 31/1032 438/95 |
| 2007/0197022 A1 * | 8/2007 | Hails | ................ C30B 25/02 257/E31.058 |
| 2014/0349430 A1 | 11/2014 | Kim | |

FOREIGN PATENT DOCUMENTS

| | | |
|---|---|---|
| CN | 105765719 A | 7/2016 |
| CN | 106653946 A | 5/2017 |
| CN | 107919403 A | 4/2018 |

* cited by examiner

*Primary Examiner* — Jaehwan Oh
(74) *Attorney, Agent, or Firm* — Global IP Services; Tianhua Gu

(57) ABSTRACT

The present invention proposes a method to form a CdSeTe thin film with a defined amount of selenium and with a high quality. The method comprises the steps of providing a base substrate and of depositing a partial CdSeTe layer on a first portion of the base substrate. The step of depositing a partial CdSeTe layer is performed at least twice, wherein a predetermined time period without deposition of a partial CdSeTe layer on the first portion of the base substrate is provided between two subsequent steps of depositing a partial CdSeTe layer. The temperature of the base substrate and the CdSeTe layer already deposited on the first portion of the base substrate is controlled during the predetermined time
(Continued)

Figure 1:
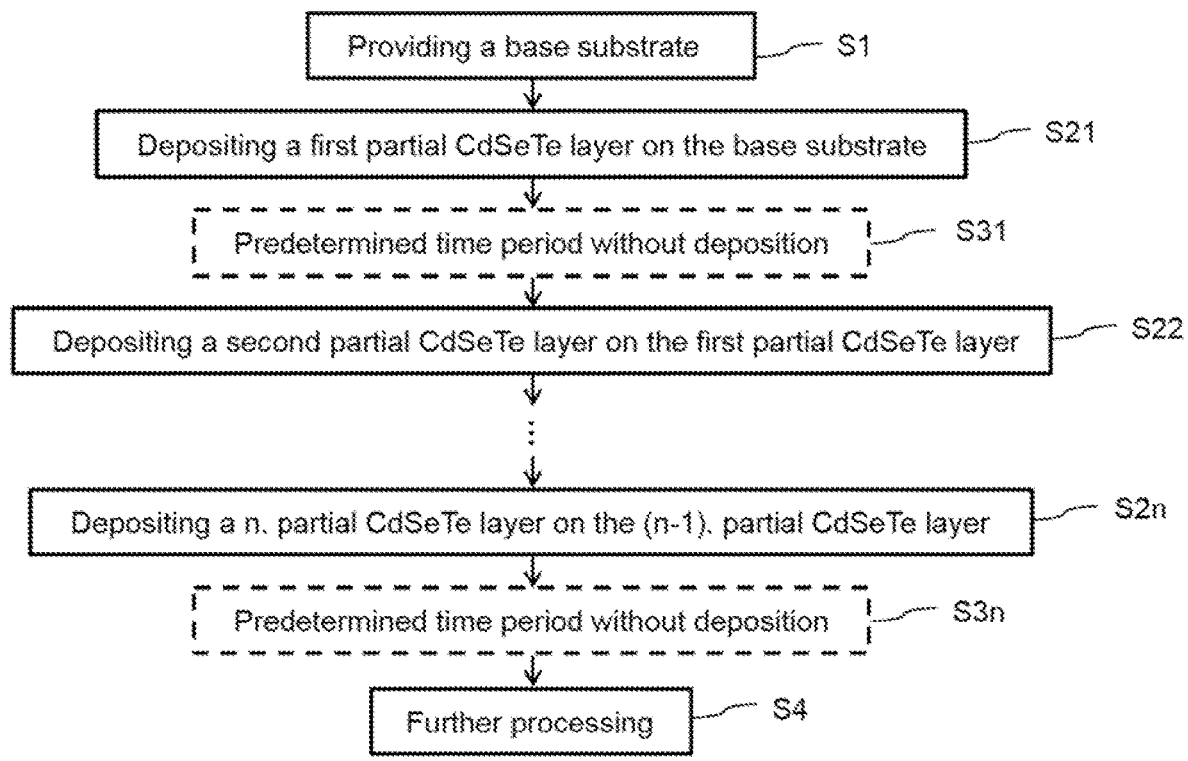

period such that re-evaporation of Cd and/or Te from the CdSeTe layer already deposited takes place.

11 Claims, 4 Drawing Sheets

(51) Int. Cl.
*C23C 14/54* (2006.01)
*C23C 14/06* (2006.01)

(58) Field of Classification Search
CPC ......... H01L 31/0296; H01L 31/022425; H01L 31/03925
See application file for complete search history.

METHOD TO DEPOSIT THIN FILM HIGH QUALITY ABSORBER LAYER

CROSS REFERENCE TO RELATED PATENT APPLICATION

The present application is the US national stage of PCT/CN2019/099810 filed on 2019 Aug. 8, which application is incorporated herein by reference.

FIELD OF TECHNOLOGY

The present invention refers to a method for forming a CdSeTe thin film structure having a defined amount of Se and a high film quality. This method is preferably used for forming a part of a photoactive layer of a CdTe thin film solar cell.

BACKGROUND

In the state of the art, the CdTe solar cell has the following structure, wherein the layers are arranged in the mentioned sequence: a transparent conducting oxide layer (TCO) formed as front contact layer; a layer of cadmium sulfide (CdS) formed as a n-doped window layer; a layer of cadmium telluride (CdTe) being the p-doped photoactive layer; and a back contact layer to collect the charge carriers. The CdS layer and the CdTe layer form a p-n junction. The front contact layer and the back contact layer may also be formed as a layer stack comprising different layers of different materials.

In order to reduce the energy gap of the photovoltaic layer and thereby increase the photovoltaic conversion efficiency, selenium is included into the CdTe layer. However, the electrical properties of the formed CdSeTe layer strongly depend on the amount of incorporated selenium and the electronic quality of the formed layer, the electronic quality depending on the electronic state of the incorporated selenium in the layer and the atomic ratio of the other elements in the layer.

CdSeTe layers are often formed on a substrate by evaporation or sublimation or by sputtering, wherein single vapor sources or sputter targets for each element or combined sources or targets for at least two elements, for instance CdSe and CdTe sources or targets, or even one source or target comprising a composition including all elements may be used. However, achieving a defined composition of the formed CdSeTe layer, i.e. a defined amount of selenium in it, is difficult due to different atom masses, different evaporation temperatures and/or different partial pressures of the individual elements or compositions. Thus, in evaporation or sublimation, the concentration of Se in a heated vapor source, also called crucible, comprising a $CdSe_xTe_y$ source material increases over time due to the low vapor pressure of CdSe compared to that of CdTe. The amount of time the material within the vapor source is or was at a temperature equal to or higher than a deposition temperature at which the substrate is held is called the hot-age of the source material. Even co-evaporation of a CdTe source material and of a Se source material is difficult to control with respect to the amount of selenium incorporated within the deposited CdSeTe layer.

SUMMARY

Therefore, it is an object of the invention to provide a method for producing a CdSeTe thin film structure having a defined amount of selenium within the CdSeTe thin film and a good electronic quality of the CdSeTe thin film.

This object is solved by a method according to the independent claim. Preferred embodiments are given in the dependent claims.

The inventive method for forming a CdSeTe thin film comprises the step of providing a base substrate and at least two steps of depositing a partial CdSeTe layer on a first portion of the base substrate, wherein a predetermined time period without deposition of a partial CdSeTe layer on the first portion of the base substrate is provided between two subsequent deposition steps. During the predetermined time period, the temperature of the base substrate and the CdSeTe layer already deposited on the first portion of the base substrate is controlled such that re-evaporation of Cd and/or Te from the CdSeTe layer already deposited takes place for at least a part of the predetermined time period. Thus, the deposited partial CdSeTe layer is enriched in selenium and the concentration of selenium within the whole CdSeTe thin layer can be controlled very precisely and depends less on the hot age of the source material or source materials than in prior art. In the result, the CdSeTe thin film as a whole is formed by a layer-by-layer method. Advantageously, the process of forming a CdSeTe thin layer as a whole is more stable, can be controlled better and the electronic quality of the CdSeTe thin film increases due to the predetermined time periods without deposition. These predetermined time periods help to form crystal structures with less defects and with less lattice stress in the formed thin film.

The temperature the base substrate, and therefore also the first portion of the base substrate, and, from the second deposition step, the CdSeTe layer already deposited on the first portion of the base substrate have during deposition is called a first temperature. The temperature the base substrate and the CdSeTe layer already deposited on the first portion of the base substrate have during the predetermined time period without deposition is called a second temperature. For at least a part of the predetermined time period, the second temperature lies in a range allowing the re-evaporation of Cd and/or Te from at least the last deposited partial CdSeTe layer. Further, the second temperature may stimulate or support crystallization of the layer. In some embodiments, the second temperature is in the range between 400° C. and 570° C., for instance in the range between 500° C. and 550° C. The second temperature may be constant during the predetermined time period without deposition or may vary during the predetermined time period. In some embodiments, the second temperature lies in the range between the first temperature and a temperature being 50 K smaller or 50 K higher than the first temperature. That is, $(T_1-50 \text{ K}) \le T_2 \le (T_1+50 \text{ K})$, wherein $T_1$ is the first temperature and $T_2$ is the second temperature. The first temperature usually lies in the range between 400° C. and 550° C. for evaporation and sublimation of CdSeTe layers and in the range between 300° C. and 450° C. for sputtering CdSeTe layers.

According to some embodiments, the step of depositing a partial CdSeTe layer on a first portion of the base substrate is performed more than twice or even more than ten times, for instance five times, seven times or fifteen times.

Depending on the number of repetitions of the step of depositing a partial CdSeTe layer on a first portion of the base substrate, the thickness of one partial CdSeTe layer deposited in one such step is smaller than half of the whole thickness of the CdSeTe thin film. In some embodiments, the thickness of one partial CdSeTe layer deposited in one such step is smaller than 150 nm, preferably smaller than 100 nm, more preferably smaller than 80 nm and even smaller than 50 nm. Forming such thin partial CdSeTe layers provides the advantage of homogeneous content of Se throughout the whole thickness of the partial CdSeTe layer.

According to some embodiments, the predetermined time period between two subsequent steps of depositing a partial CdSeTe layer on a first portion of the base substrate is larger than 2 s (seconds). In special embodiments, the predetermined time period between two subsequent steps of depositing a partial CdSeTe layer on a first portion of the base substrate is smaller than 10 s, preferably smaller than 5 s (seconds). That is, in these special embodiments, the predetermined time period between two subsequent steps of depositing a partial CdSeTe layer on a first portion of the base substrate is larger than 2 s (seconds), but at the same time smaller than 10 s or even smaller than 5 s (seconds).

Each partial CdSeTe layer is deposited by evaporation or sublimation or sputtering the respective elements from one source or a group of sources. Since most sources can apply a layer only onto a region of the base substrate the extension of which is very small in one lateral direction, for instance only 100 mm to 200 mm, base substrates having a larger extension in the one lateral direction are moved over or below the source.

In some embodiments, the base substrate is moved linearly along a first direction over or below different sources or different groups of sources during performing the steps of depositing a partial CdSeTe layer on a first portion of the base substrate. The different sources or different groups of sources are arranged separated from each other along the first direction with a predetermined distance between them. In these embodiments, the CdSeTe layer may be formed in a continuous deposition apparatus, also called in-line apparatus, wherein the base substrate is moved through the deposition apparatus in a continuous movement or in a discontinuous manner, but in any case along one direction from the entrance into the deposition apparatus to an outlet of the deposition apparatus and passing different sources or different groups of sources. For continuous movement of the base substrate, the space between different sources or different group of sources is determined by the product of a velocity of the movement of the base substrate and the predetermined time period. For discontinuous movement of the base substrate, the space between different sources or different group of sources is at least such, that no partial CdSeTe layer is deposited on the first portion of the substrate during the predetermined time period.

According to other embodiments, the base substrate is moved over or below the source or the group of sources during performing a first step of depositing a partial CdSeTe layer on a first portion of the base substrate, moved away from the source or the group of sources during the predetermined time period and moved over or below the same source or the same group of sources during performing a second step of depositing a partial CdSeTe layer on a first portion of the base substrate performed subsequently to the first step of depositing a partial CdSeTe layer on a first portion of the base substrate. In a particular embodiment, the base substrate is moved linearly over or below the source or the group of sources along a first direction during performing the first step of depositing a partial CdSeTe layer on a first portion of the base substrate and along a second direction opposite to the first direction during performing the second step of depositing a partial CdSeTe layer on a first portion of the base substrate.

All of the steps of depositing a partial CdSeTe layer on a first portion of the base substrate and of the predetermined time periods lying between them can be performed according to the first manner or the second manner. However, both kinds of embodiments of movement may also be combined within the method of forming a CdSeTe thin film.

The major parameters influencing the quality of the formed CdSeTe thin film are the predetermined time period without deposition, the thickness of the individual partial CdSeTe layers, the deposition rate of CdSeTe during the deposition of a partial CdSeTe layer, the number of the steps for depositing a partial CdSeTe layer on a first portion of the base substrate and the first and second temperatures, i.e. the substrate temperatures during the deposition steps and during the predetermined time period without deposition. Advantageously, the source temperature, the condition of the source material and the hot-age of the source material are not so important parameters influencing the quality of the formed CdSeTe thin film as in the prior art. Nevertheless, the predetermined time can be defined according to the hot-age of the crucible.

Several combinations of the embodiments of the inventive method are possible, as long as they do not preclude each other.

In the following detailed description reference is made to the accompanying drawings, which form a part hereof and in which specific embodiments are illustrated, in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims. The elements of the drawings are not necessarily to scale relative to each other. Like reference numbers designate corresponding similar parts.

FIGURES

FIG. 1 schematically shows an embodiment of the method according to the invention.

Figure 2:
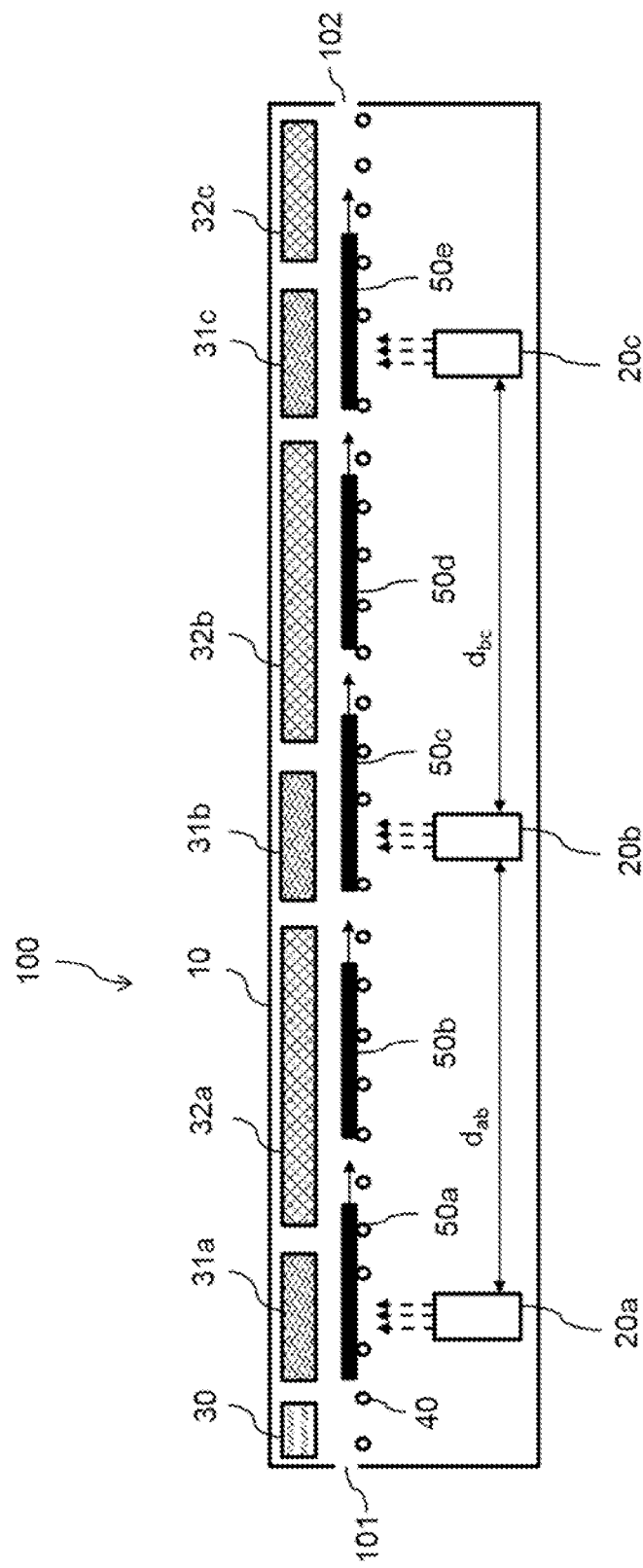

FIG. 2 schematically shows an exemplary embodiment of an apparatus suitable for performing a first embodiment of the method according to the invention.

Figure 3:
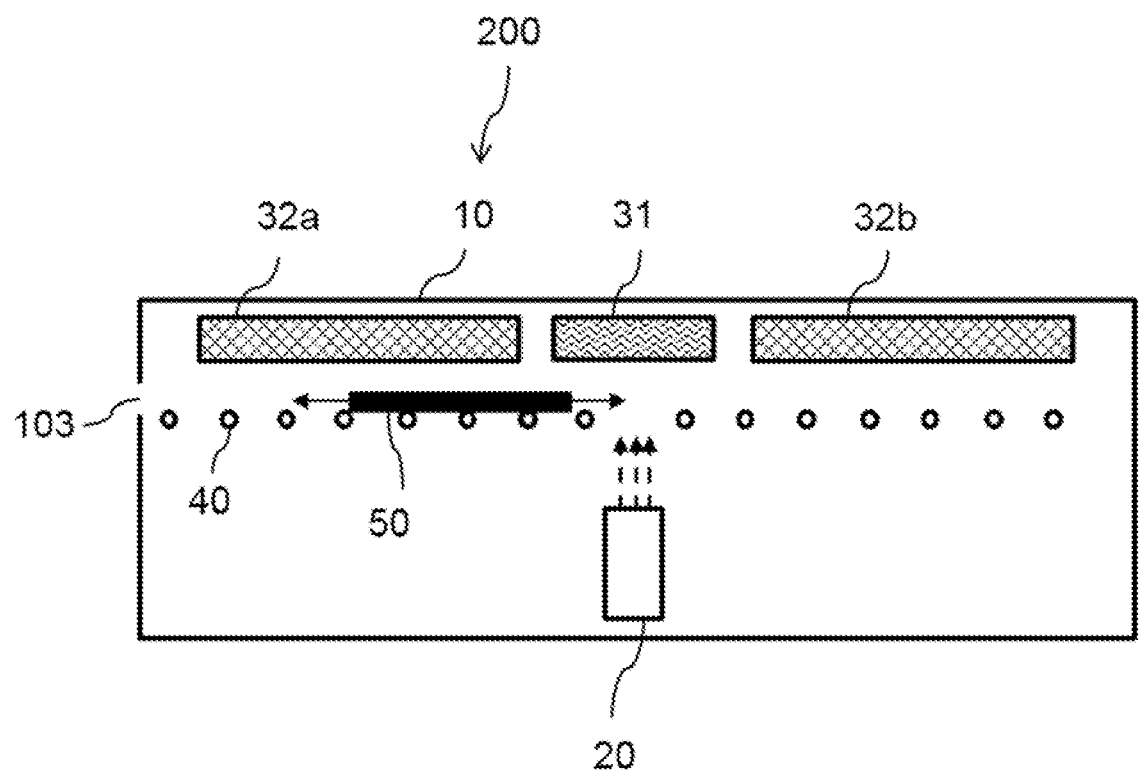

FIG. 3 schematically shows an exemplary embodiment of an apparatus suitable for performing a second embodiment of the method according to the invention.

Figure 4:
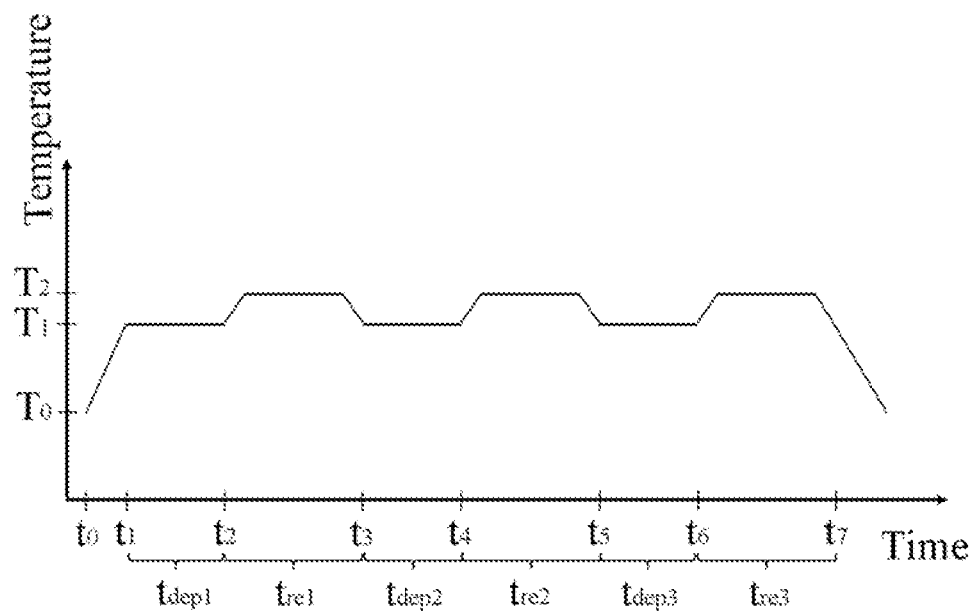

FIG. 4 schematically shows an exemplary embodiment of a course of a temperature of the base substrate over time for performing an embodiment of the method according to the invention.

Figure 5:
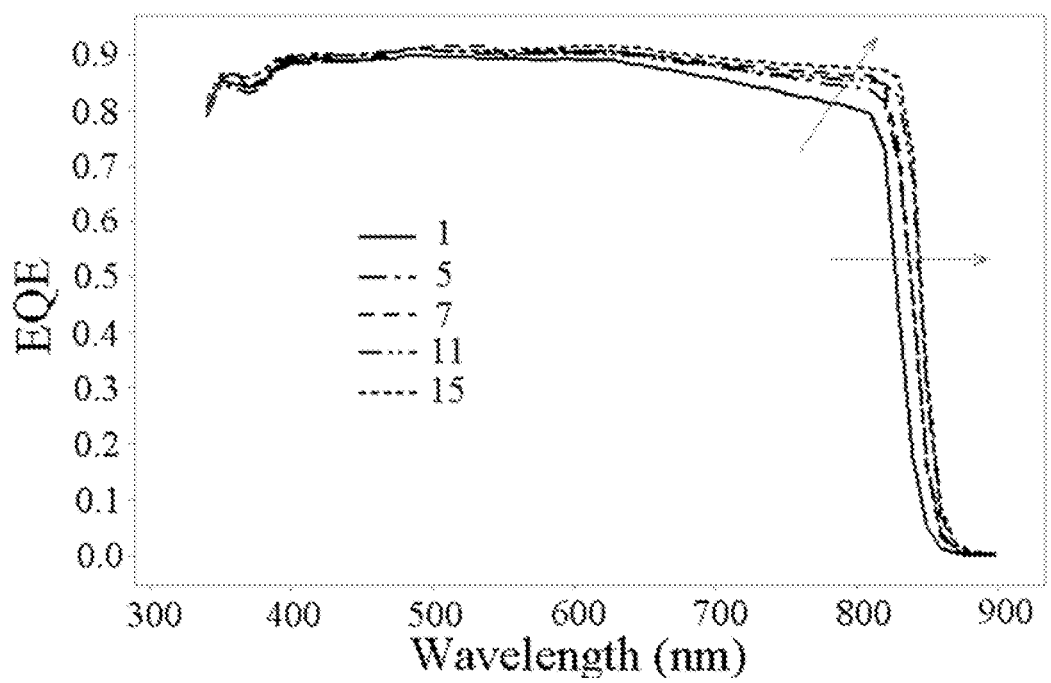

FIG. 5 schematically shows the EQE of solar cells comprising different CdSeTe thin films formed according to the invention.

EXEMPLARY EMBODIMENTS

FIG. 1 schematically shows an embodiment of the method according to the invention. First of all, a base substrate is provided (step S1). The base substrate may comprise different layers and materials along a thickness direction of the base substrate and/or along a direction perpendicular to the thickness direction of the base substrate, i.e. in a lateral direction. The base substrate may be, for instance, a semi-finished CdTe solar cell device, wherein different layers according to a used production configuration are present. That is, if the solar cell device is formed in superstrate configuration, the base substrate usually comprises a glass substrate, a transparent conducting oxide layer (TCO) as a front contact and a layer of cadmium sulfide (CdS) as a window layer on top of each other along the thickness direction of the base substrate. The TCO layer can include a high resistive buffer layer. If the solar cell device is formed in substrate configuration, the base substrate usually comprises a backside substrate, e.g. of glass, on which a backside contact layer is deposited.

On the top layer of the base substrate, i.e. the window layer or the backside contact layer, a first partial CdSeTe layer is deposited at least in a first portion of the base substrate in step S21. Although not shown in FIG. 1, any preparation steps, e.g. a cleaning step or a heating step, may be performed between steps S1 and S21. The first portion is a lateral portion of the base substrate and extends over at least a part of a surface of the base substrate, the surface extending in a plane perpendicular to the thickness direction of the base substrate. Usually, the whole surface of the base substrate is applied with the deposited CdSeTe layer, except of edge portions where the base substrate is held during deposition. At least the first portion of the base substrate is held at a first temperature during the deposition step.

After deposition, the base substrate with the deposited partial CdSeTe layer is removed for a predetermined time period from the deposition position (step S31). That is, no deposition on the base substrate is performed during the predetermined time period. However, the temperature of the base substrate, and the first partial CdSeTe layer, is controlled at least in the first portion of the base substrate during the predetermined time period such that re-evaporation of Cd and/or Te from the first partial CdSeTe layer takes place in the first portion. By selecting a specific temperature and a specific length of the predetermined time period, the ratio of selenium within the first partial CdSeTe layer can be adjusted with respect to the ratio of selenium as deposited.

Subsequent to the predetermined time period without deposition, a second partial CdSeTe layer is deposited on the first CdSeTe layer (step S22). This step is in principal equal to step S21 and is followed by another predetermined time period without deposition.

As can be seen in FIG. 1, deposition steps and predetermined time periods without deposition are performed alternating, wherein the whole method comprises n deposition steps and n predetermined time periods without deposition. That is, a last deposition step S2n causing the deposition of a $n^{th}$ partial CdSeTe layer on the previous partial CdSeTe layer, i.e. the (n−1). partial CdSeTe layer, is performed after a directly preceding predetermined time period without deposition and is followed by a last predetermined time period without deposition (step S3n).

In the result, a CdSeTe layer is formed by depositing n partial CdSeTe layers wherein the ratio of selenium within the CdSeTe layer is controlled and adjusted by re-evaporation of Cd and/or Te from the respective partial CdSeTe layer during predetermined time periods without deposition. The amount n is equal or larger than 2 and may, for instance, lie in the range between 2 and 20 (including the edges). Afterwards, the base substrate is usually further processed to fabricate a solar cell device (step S4).

Depending on the temperature needed for re-evaporation of Cd and/or Te from the deposited CdSeTe layer, the last predetermined time period without deposition may also be a normal handling period used for transporting the base substrate to a next processing step.

FIG. 2 schematically shows an exemplary embodiment of an apparatus 100 suitable for performing a first embodiment of the method according to the invention. The first embodiment of the method is characterized by a linear movement of the base substrate along a first direction over or below different sources, each source providing the elements for the deposition of the partial CdSeTe layers. "Linear movement" does not necessarily mean movement along a straight line, but means that the base substrate is moved forward all the time from one source to the next source. That is, the line might be a straight line, a curved line or even a line forming a turn. In the result, "the first direction" is not understood as a concrete direction in the x-y-z-coordinate system, but as a direction connecting one source with the next source in line. In other words: The first embodiment of the method is an in-line method and the apparatus 100 is an in-line apparatus having an inlet 101 for introducing a base substrate at a first side of the apparatus 100 and an outlet 102 for removing a base substrate at a second side of the apparatus 100, wherein the base substrate is moved forward along the first direction from the inlet 101 to the outlet 102 without any backward movement. Often, the second side of the apparatus 100 is opposite to the first side of the apparatus 100, but there might be other configurations.

The apparatus 100 comprises three sources 20a to 20c, each source providing all of the elements for depositing a CdSeTe layer. The sources 20a to 20c may be sputter targets or evaporation or sublimation crucibles. Each source 20a to 20c may provide the elements cadmium, selenium and tellurium from one single target or crucible or may be a group of different targets or crucibles providing one or two of the mentioned elements or even providing further elements, for instance doping elements. The number of sources 20a to 20c equals the number of deposition steps of partial CdSeTe layers and is not limited to three as shown in FIG. 2. It may reach from 2 to n, for instance to 20. According to the embodiment shown in FIG. 2, all sources 20a to 20c are arranged in a common chamber 10, but they may also be arranged in different chambers. The apparatus 100 further comprises temperature control devices 30, 31a to 31c and 32a to 32c and a transport system 40 suitable for moving base substrates 50a to 50e through the chamber along the first direction connecting the inlet 101 with the outlet 102. The movement of the base substrates 50a to 50e is indicated by the solid arrows. The substrates 50a to 50e may be moved at a steady pace, i.e. constantly, or may be moved with different velocities and may even pause for a while. The transport system 40 may comprise rollers or shafts or belts or any other suitable device for holding and moving the base substrates 50a to 50e through the apparatus 100.

While the base substrates 50a to 50e are moved through the apparatus 100, they subsequently pass the sources 20a to 20c, wherein each time a partial CdSeTe layer is deposited on the base substrates 50a to 50e. Although a bottom-up deposition is shown in FIG. 2, the deposition of the partial CdSeTe layers may also be performed in a top-down deposition in other embodiments. The sources 20a to 20c are arranged with a distance between adjacent sources, i.e. the source 20b is arranged from the source 20a with a distance $d_{ab}$ and the source 20c is arranged from the source 20b with a distance $d_{bc}$. The distances are measured along the first direction. Due to these distances, each base substrate 50a to 50e moves along the first direction over predetermined time periods without depositing CdSeTe onto the base substrate. In these time periods, in addition to the crystallization process, the re-evaporation of Cd and/or Te from the deposited CdSeTe layer occurs. The distances $d_{ab}$ and $d_{bc}$ between the different sources 20a to 20b may be equal or different, depending on the desired amount of re-evaporation of Cd and/or Te during the respective predetermined time periods.

The temperature control devices 31a to 31c control the temperature of the base substrates 50a to 50e at locations where the sources 20a to 20c are arranged, whereas the temperature control devices 32a to 32c control the temperature of the base substrates 50a to 50e at locations between the sources 20a to 20c and after the last source 20c with respect to the first direction. Thus the temperature control devices 31a to 31c hold the base substrates 50a to 50e at the first temperature during deposition of the partial CdSeTe layers, and the temperature control devices 32a to 32c hold the base substrates 50a to 50e at the second temperature for at least a part of the predetermined time periods without deposition. The first temperature is chosen such that a partial CdSeTe layer with desired characteristics, e.g. grain sizes and density, is formed on the first portion of the base substrate. The second temperature is chosen such that a desired amount of Cd and/or Te re-evaporates from the deposited partial CdSeTe layer. The temperature control device 30 is a device which helps to bring the base substrates 50a to 50e form a starting temperature the base substrates have when entering the apparatus 100 to a temperature near the first temperature. However, the temperature control device 30 may also be omitted, for instance, if the starting temperature is already near the first temperature. Since the first temperature and the second temperature are usually in the range between 300° C. and 700° C., the temperature control devices 30, 31a to 31c and 32a to 32c often comprise a heater. However, they may comprise a cooling device instead or additionally.

The advantage of the first embodiment of the method according to the invention is that a plurality of base substrates may be processed simultaneously in one apparatus. Furthermore, different amounts of cadmium, selenium and tellurium or of further elements may be provided in different partial CdSeTe layers in a simple manner by providing differing sources or differing deposition conditions or differing second temperatures during the predetermined time periods. The length of the different predetermined time periods may be adjusted primarily by different distances between different adjacent sources, since usually the velocity of the movement of the base substrates is constant throughout the whole apparatus.

FIG. 3 schematically shows an exemplary embodiment of an apparatus 200 suitable for performing a second embodiment of the method according to the invention. The second embodiment of the method is characterized by moving a base substrate 50 over or below one and the same source 20 at least twice. That is, only one source 20 is arranged in a chamber 10 of the apparatus 200 and the base substrate 50 is moved over or below the source 20 during a first step of depositing a partial CdSeTe layer, moved and may be held away from the source 20 during the predetermined time period and again moved over or below the same source 20 during a second step of depositing a partial CdSeTe layer. In the exemplary embodiment of FIG. 3, the base substrate 50 is moved linearly along a first direction over the source 20 during the first deposition step, for instance away from an opening 103 in the chamber 10, held on one side of the source 20, e.g. the right side, and away from the source 20 during a first predetermined time period, and moved linearly along a second direction over the source 20 during the second deposition step, for instance to the opening 103. That is, the first and the second direction are opposite to each other, as indicated by the solid arrows in FIG. 3. The for- and backward moving of the base substrate 50 within the chamber 10 may be repeated several times, wherein the velocity of movement may differ for different deposition steps. Furthermore, the length of different predetermined time periods without deposition may be adjusted easily, as well as the number of deposition steps. In the shown embodiment of the apparatus 200, only even numbers of deposition steps can be performed, since only one opening 103 is provided in the chamber 10 for entering and removing the base substrate 50. If two openings 103 on opposite sides of the chamber 10 are provided, also an odd number of deposition steps, the number being larger than 2, can be performed.

The temperature of the base substrate 50 as well as of the CdSeTe layer already deposited on the base substrate 50 is controlled by a temperature control device 31 during deposition steps and by temperature control devices 32a and 32b during the predetermined time periods without deposition.

In other embodiments of the apparatus suitable for performing the second embodiment of the method according to the invention, the base substrate may be arranged on a rotating holder, wherein the rotation axis of the rotating holder is arranged on a side of the source. Thus, the base substrate is moved over or below the source for a first time period and then is moved over a region without a source for the predetermined time period while the rotating holder rotates.

In other embodiments of the apparatus suitable for performing the method according to the invention, shutters may be used for interrupting the deposition of the CdSeTe layer and dividing it into a plurality of steps of depositing a partial CdSeTe layer, wherein the predetermined time periods without deposition are the time periods the shutter is placed between the source and the base substrate.

As can be seen, a person skilled in the art knows may derive a lot of embodiments of the method according to the invention and a lot of apparatuses suitable for performing the method according to the invention.

With respect to FIG. 4, an exemplary embodiment of a course of a temperature of the base substrate over time is explained. When the method starts at $t_0$, the base substrate has a starting temperature $T_0$, for instance 100° C. Before the first deposition step begins at $t_1$, the temperature is increased by heaters from $T_0$ to the first temperature $T_1$, for instance 450° C. Deposition of a first partial CdSeTe layer takes place between $t_1$ and $t_2$, called a first time period of deposition $t_{dep1}$. During $t_{dep1}$, the base substrate is, for instance, moved over or below a first source, and the temperature of the base substrate is held at the first temperature $T_1$. When the deposition of the first partial CdSeTe layer is finished at $t_2$, a first predetermined time period without deposition $t_{re1}$ starts, the first predetermined time period $t_{re1}$ lasting to $t_3$. During $t_{re1}$, the base substrate is held at the second temperature $T_2$ for a part of $t_{re1}$. The second temperature $T_2$ is larger than $T_1$, for instance 500° C., allowing the re-evaporation of Cd and/or Te from the first partial CdSeTe layer. At $t_3$, the base substrate again has the first temperature $T_1$ and a second time period of deposition $t_{dep2}$ starts, wherein the base substrate is moved over or below a second source, and the temperature of the base substrate is held at the first temperature $T_1$. At the end of $t_{dep2}$, i.e. at $t_4$, a second partial CdSeTe layer on the base substrate and the CdSeTe layer resulting from the first deposition process and the re-evaporation during the first predetermined time period $t_{re1}$ is deposited. A second predetermined time period without deposition $t_{re2}$ starts at $t_4$ and ends at $t_5$. For at least a part of $t_{re2}$, the base substrate is held again at the second temperature $T_2$ and Cd and/or Te is partially re-evaporated from the second partial CdSeTe layer. At $t_5$, a third time period of deposition $t_{dep3}$ starts, during which the base substrate again is held at the first temperature $T_1$. When $t_{dep3}$ ends at $t_6$, a third partial CdSeTe layer is deposited on the base substrate and the CdSeTe layer formed before. Subsequently, a third predetermined time period without deposition $t_{re3}$ follows, wherein the base substrate is held at $T_2$ for at least a part of $t_{re3}$. The third predetermined time period without deposition $t_{re3}$, during which re-evaporation of Cd and/or Te from the third partial CdSeTe layer occurs, starts at $t_6$ and ends at $t_7$, when the temperature of the base substrate reaches the first temperature $T_1$. After $t_7$, the temperature of the base substrate further decreases till it reaches a temperature of the next processing step or a handling step performed with respect to the base substrate and the CdSeTe thin film formed thereon.

Although a second temperature $T_2$ higher than the first temperature $T_1$ is shown in FIG. 4, the second temperature $T_2$ may be equal to the first temperature $T_1$ or even lower than the first temperature $T_1$ as long as partial re-evaporation of Cd and/or Te occurs from the respective deposited CdSeTe layer. Furthermore, the starting temperature $T_0$ may be lower or higher than the mentioned temperature value and may even be higher than the first temperature $T_1$. Similarly, the temperature of the base substrate may not decrease as much as it is shown in FIG. 4 or even not decrease at all after the third predetermined time period without deposition $t_{re3}$ ends, as long as the temperature of the base substrate does not reach a temperature resulting in an undesired change of the composition or structure of the CdSeTe layer or in re-evaporation of the whole CdSeTe layer. Further, all temperature rises and decreases are shown as linear processes. However, the temperature may increase or fall also non-linearly, wherein the decrease of the temperature of the base substrate may be effected actively, i.e. by cooling of the base substrate, or passively, i.e. only by removing a heat source. Moreover, the temperature of the substrate between two predetermined time periods, i.e. the temperature during a time period of deposition, might not be constant. It might be linearly increasing or decreasing or varying in any other way. In such case the variation in the temperature can be in the range of the $T_1\pm10°$ C., or more preferable $T_1\pm5°$ C.

Further, the individual time periods of deposition $t_{dep1}$ to $t_{dep3}$ may have the same length or different lengths. The same is true for the individual predetermined time periods without deposition $t_{re1}$ to $t_{re3}$. Moreover, the second temperature $T_2$ may differ for the different predetermined time periods without deposition $t_{re1}$ to $t_{re3}$. Even the first temperature $T_1$ may differ for the different time periods of deposition $t_{dep1}$ to $t_{dep3}$.

FIG. 5 schematically shows the EQE (external quantum efficiency) of fabricated solar cells comprising different CdSeTe thin films. Some of the CdSeTe thin films are formed using the method according to the invention, wherein different numbers of steps for depositing a partial CdSeTe layer and of predetermined time periods without deposition are performed. The graph characterized by only one deposition step is measured for a solar cell fabricated using a conventional method of forming a CdSeTe thin film, i.e. the CdSeTe thin film is deposited as a whole without predetermined time periods of re-evaporation. The measured solar cells are all formed with the same materials and thicknesses for the individual layers of the solar cell. Also the formed CdSeTe thin film has the same thickness and is formed using the same sources, i.e. a CdSeTe crucible for sublimation, for all solar cells.

As can be seen, as the number of deposition steps and of predetermined time periods without deposition and with re-evaporation of Cd and/or Te increases, the EQE increases in the range of 700 nm to 800 nm. This means that an enhanced charge carrier collection in this range of wavelengths occurs, which is related to a high quality of the formed CdSeTe thin film with reduced recombination of charge carriers, i.e. a longer charge carrier lifetime. Furthermore, the absorption band edge is shifted to higher wavelength as the number of deposition steps increases. This indicates that the band gap is reduced in the formed CdSeTe thin film and more light can be converted into electrical energy by the solar cell.

The embodiments of the invention described in the foregoing description are examples given by way of illustration and the invention is nowise limited thereto. Any modification, variation and equivalent arrangement as well as combinations of embodiments should be considered as being included within the scope of the invention.

REFERENCE NUMERALS 100, 200 Apparatus
10 Chamber
101 Inlet
102 Outlet
103 Opening
20, 20a-20c Deposition source
30, 31, 31a-31c, Temperature control device
32a-32c
40 Transportation system
50, 50a-50e Base substrate
$d_{ab}$, $d_{bc}$ Distance between sources
$T_0$ Starting temperature
$T_1$ First temperature
$T_2$ Second temperature
$t_0$-$t_7$ Instant of time
$t_{dep1}$-$t_{dep3}$ Time period of deposition
$t_{re1}$-$t_{re3}$ Time period without deposition

What is claimed is:

1. Method for forming a CdSeTe thin film comprising the steps:
   a) providing a base substrate (50, 50a-50e), and
   b) depositing a partial CdSeTe layer on a first portion of the base substrate (50, 50a-50e), wherein the first portion is held at a first temperature ($T_1$) during deposition, characterized in that step b) is performed at least twice, wherein a predetermined time period ($t_{re1}$-$t_{re3}$) without deposition of a partial CdSeTe layer on the first portion of the base substrate (50, 50a-50e) is provided between two subsequent steps b) and wherein the temperature of the base substrate (50, 50a-50e) and the CdSeTe layer already deposited on the first portion of the base substrate (50, 50a-50e) is controlled during the predetermined time period ($t_{re1}$-$t_{re3}$) such that re-evaporation of Cd and/or Te from the CdSeTe layer already deposited takes place.

2. Method according to claim 1, characterized in that the first portion of the base substrate (50, 50a-50e) and the CdSeTe layer already deposited are held at a second temperature ($T_2$) during the predetermined time period ($t_{re1}$-$t_{re3}$) for at least a part of the predetermined time period ($t_{re1}$-$t_{re3}$), the second temperature ($T_2$) lying in the range between 400° C. and 570° C.

3. Method according to claim 2, characterized in that the second temperature ($T_2$) lies in the range between the first temperature ($T_1$) and a temperature being 50 K smaller or 50 K higher than the first temperature ($T_1$).

4. Method according to claim 1, characterized in that step b) is performed more than twice.

5. Method according to claim 4, characterized in that step b) is performed more than ten times.

6. Method according to claim 1, characterized in that the thickness of one partial CdSeTe layer deposited in step b) is smaller than half of the whole thickness of the CdSeTe thin film or smaller than 150 nm.

7. Method according to claim 1, characterized in that the predetermined time period ($t_{re1}$-$t_{re3}$) between two subsequent steps b) is larger than 2 seconds.

8. Method according to claim 7, characterized in that the predetermined time period ($t_{re1}$-$t_{re3}$) between two subsequent steps b) is smaller than 10 seconds.

9. Method according to claim 1, characterized in that each partial CdSeTe layer is deposited by evaporation or sublimation or sputtering the respective elements from one source (20a-20c) or a group of sources and in that the base substrate (50a-50e) is moved linearly along a first direction over or below different sources (20a-20c) or different groups of sources during performing the steps b), wherein the different sources (20a-20c) or different groups of sources are arranged separated from each other along the first direction with a predetermined distance ($d_{ab}$, $d_{bc}$) between them.

10. Method according to claim 1, characterized in that each partial CdSeTe layer is deposited by evaporation or sublimation or sputtering the respective elements from one source (20) or a group of sources and in that the base substrate (50) is moved over or below the source (20) or the group of sources during performing a first step b), moved away from the source (20) or the group of sources during the predetermined time period ($t_{re1}$-$t_{re3}$) and moved over or below the same source (20) or the same group of sources during performing a second step b) performed subsequently to the first step b).

11. Method according to claim 10, characterized in that the base substrate (50) is moved linearly over or below the source (20) or the group of sources along a first direction during performing the first step b) and along a second direction opposite to the first direction during performing the second step b).

* * * * *